United States Patent
Joo

(10) Patent No.: US 10,976,955 B2
(45) Date of Patent: Apr. 13, 2021

(54) SEMICONDUCTOR DEVICE FOR IMPROVING CODE PROCESSING SPEED USING FASTER CLOCK SIGNAL

(71) Applicant: SK hynix Inc., Icheon-si (KR)

(72) Inventor: Byoung In Joo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 34 days.

(21) Appl. No.: 16/360,382

(22) Filed: Mar. 21, 2019

(65) Prior Publication Data

US 2019/0369906 A1    Dec. 5, 2019

(30) Foreign Application Priority Data

Jun. 4, 2018    (KR) .................. 10-2018-0064205

(51) Int. Cl.
*G06F 12/00*    (2006.01)
*G06F 3/06*    (2006.01)

(52) U.S. Cl.
CPC .......... *G06F 3/0655* (2013.01); *G06F 3/0604* (2013.01); *G06F 3/0679* (2013.01)

(58) Field of Classification Search
None
See application file for complete search history.

(56) References Cited

U.S. PATENT DOCUMENTS

2003/0167384 A1*  9/2003  Wu ...................... G06F 13/1689
                                                711/167
2015/0316953 A1*  11/2015  Nariai ................... B41J 29/393
                                                713/600

FOREIGN PATENT DOCUMENTS

KR        100663902 B1    1/2007

* cited by examiner

*Primary Examiner* — Daniel D Tsui
(74) *Attorney, Agent, or Firm* — William Park & Associates Ltd.

(57) ABSTRACT

A semiconductor device includes a first processor configured to process a first code based on a first clock signal; and a second processor, controlled by the first processor, electrically coupled to a memory, and configured to process a second code based on the first clock signal and a second clock signal, wherein the second clock signal has a faster cycle than the first clock signal.

20 Claims, 6 Drawing Sheets

US 10,976,955 B2

SEMICONDUCTOR DEVICE FOR IMPROVING CODE PROCESSING SPEED USING FASTER CLOCK SIGNAL

CROSS-REFERENCES TO RELATED APPLICATION

The present application claims priority under 35 U.S.C. § 119(a) to Korean application number 10-2018-0064205, filed on Jun. 4, 2018, in the Korean Intellectual Property Office, which is incorporated herein by reference in its entirety.

BACKGROUND

1. Technical Field

Various embodiments generally relate to a semiconductor device, and more particularly, to a semiconductor device including a memory device.

2. Related Art

A semiconductor device or specifically a semiconductor memory device may be used to store data. The semiconductor memory device may be roughly classified into a nonvolatile memory device and a volatile memory device.

The nonvolatile memory device may retain data stored therein, even though no power is applied. The nonvolatile memory device may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

The volatile memory device might not retain data stored therein but lose the data, when no power is applied. The volatile memory device may include a Static Random Access Memory (SRAM), a Dynamic Random Access Memory (DRAM), and the like.

SUMMARY

In an embodiment, a semiconductor device may include a first processor configured to process a first code based on a first clock signal; and a second processor, controlled by the first processor, electrically coupled to a memory, and configured to process a second code based on the first clock signal and a second clock signal, wherein the second clock signal has a faster cycle than the first clock signal.

In an embodiment, a semiconductor device may include a first processor configured to generate a first control signal from a first code and output the first control signal, based on a first clock signal; a second processor, controlled by the first processor, configured to generate a second control signal from a second code and output the second control signal, based on a second clock signal; and an execution unit configured to execute an internal operation corresponding to the first or second control signal, in response to the corresponding control signal.

In an embodiment, a semiconductor device may include a boost memory configured to store a boost code; a first processor configured to operate based on a first clock signal; a second processor, controlled by the first processor, electrically coupled to the boost memory, and configured to read the boost code from the boost memory based on the first clock signal, generate a boost control signal from the boost code and output the boost control signal, based on a second clock signal having a faster cycle than the first clock signal; and an execution unit configured to execute an internal operation in response to the boost control signal.

DETAILED DESCRIPTION

Figure 1:
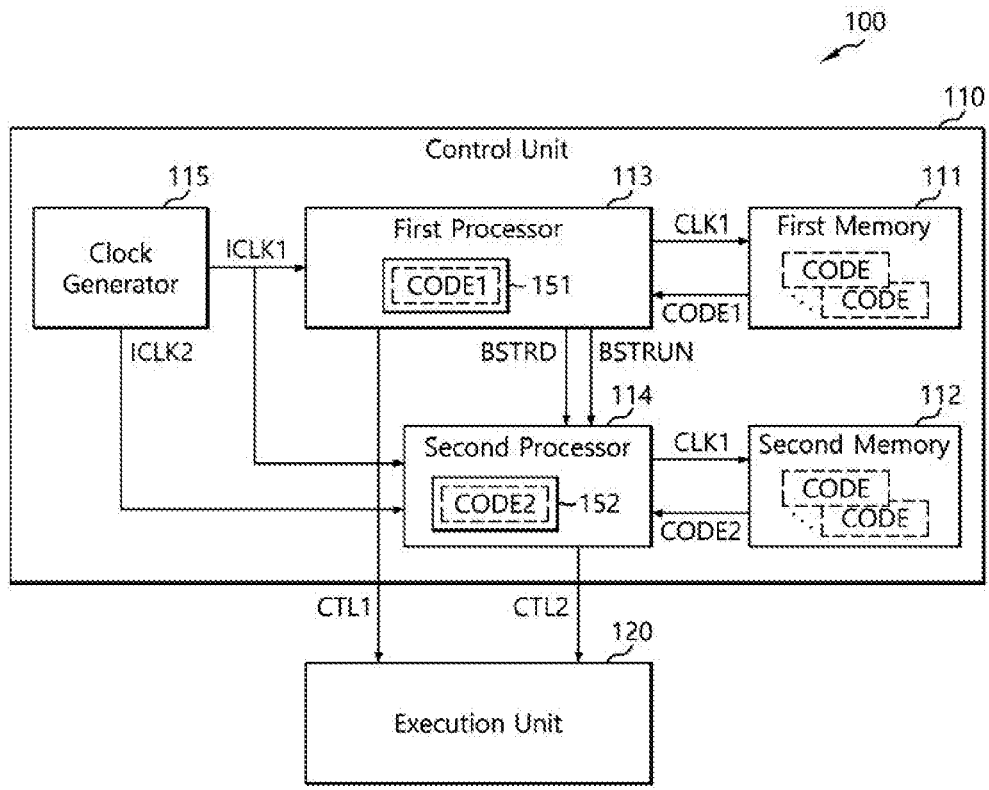
FIG. 1 is a block diagram illustrating a semiconductor device in accordance with an embodiment.

The advantages and characteristics of the present disclosure and a method for achieving the advantages and characteristics will be described through the following embodiments with reference to the accompanying drawings. However, the present disclosure is not limited to the embodiments described herein, but may be embodied in different manners. The present embodiments are only provided to describe the present disclosure in detail, such that the technical idea of the present disclosure can be easily carried out by those skilled in the art to which the present disclosure pertains.

The present embodiments are not limited to specific shapes illustrated in the drawings, but may be exaggerated for clarity. In this specification, specific terms are used. However, the terms are only used to describe the present disclosure, and not used to limit the scope of the present disclosure, described in claims.

In this specification, an expression such as 'and/or' may indicate including one or more of elements listed before/after the expression. Moreover, an expression such as 'connected/coupled' may indicate that one element is directly connected/coupled to another element or indirectly connected/coupled to another element through still another element. The terms of a singular form may include plural forms unless referred to the contrary. Furthermore, the meanings of 'include' and 'comprise' or 'including' and 'comprising' may specify a component, step, operation and element, and do not exclude the presence of addition of one or more other components, steps, operations and elements.

Hereafter, exemplary embodiments of the present disclosure will be described in detail with reference to the drawings.

FIG. 1 is a block diagram illustrating a semiconductor device 100 in accordance with an embodiment.

Referring to FIG. 1, the semiconductor device 100 may include a control unit 110 and an execution unit 120.

The control unit 110 may control overall operations of the semiconductor device 100. The control unit 110 may generate first and second control signals CTL1 and CTL2 and transfer the first and second control signals CTL1 and CTL2 to the execution unit 120. The first and second control signals CTL1 and CTL2 may be used to control the execution unit 120 to execute predetermined internal operations.

The word "predetermined" as used herein with respect to a parameter, such as a predetermined amount of time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The control unit 110 may include a first memory 111, a second memory 112, a first processor 113, a second processor 114 and a clock generator 115.

The first and second memories 111 and 112 (for example, a main memory and a boost memory, respectively) may store codes CODE therein. The codes CODE may include executable programs required for an operation of the semiconductor device 100.

The first and second memories 111 and 112 may be configured as nonvolatile memories capable of storing the codes CODE even though no power is supplied to the semiconductor device 100. For example, each of the first and second memories 111 and 112 may be configured as a Read Only Memory (ROM), an Erasable and Programmable-Read Only Memory (EPROM), an Electrically Erasable and Programmable-Read Only Memory (EEPROM), MASK-ROM, a flash memory, a Ferroelectrics Random Access Memory (FeRAM), a Phase-Change Random Access Memory (PCRAM), a Magnetoresistive Random Access Memory (MRAM), a Resistive Random Access Memory (ReRAM), and the like. The first and second memories 111 and 112 may be configured as the same type of nonvolatile memories or different types of nonvolatile memories.

The first memory 111 may be electrically coupled to the first processor 113. The first memory 111 may operate based on a first clock signal CLK1 transferred from the first processor 113. The first memory 111 may transfer a first code CODE1 requested by the first processor 113 to the first processor 113, based on the first clock signal CLK1. That is, the first code CODE1 may be outputted to the first processor 113 from the first memory 111 in synchronization with the first dock signal CLK1. The first code CODE1 may correspond to any one of the codes CODE stored in the first memory 111. The first memory 111 may serve as a main memory.

The second memory 112 may be electrically coupled to the second processor 114. The second memory 112 may operate based on the first clock signal CLK1 transferred from the second processor 114. The second memory 112 may transfer a second code CODE2 requested by the second processor 114 to the second processor 114, based on the first clock signal CLK1. That is, the second code CODE2 may be outputted to the second processor 114 from the second memory 112 in synchronization with the first clock signal CLK1. The second code CODE2 may correspond to any one of codes CODE stored in the second memory 112. The second memory 112 may include a boost memory.

The first processor 113 may process the first code CODE1 based on the first clock signal CLK1. Specifically, the first processor 113 may read the first code CODE1 from the first memory 111 based on the first clock signal CLK1. The first code CODE1 may correspond to any one of the codes CODE stored in the first memory 111. The first processor 113 may generate the first control signal CTL1 from the first code CODE1 based on the first clock signal CLK1, and transfer the first control signal CTL1 to the execution unit 120. The first processor 113 may serve as a main processor.

The first processor 13 may temporarily store the first code CODE1 read from the first memory 111 in a first storage unit 151. The first processor 113 may temporarily store the first code CODE1, read from the first memory 111, in the first storage unit 151 when the first code CODE1 is not immediately processed.

The first processor 113 may control the second processor 114 to process the second code CODE2. Specifically, the first processor 113 may transfer a boost read signal BSTRD to the second processor 114, in order to control the second processor 114 to read the second code CODE2 from the second memory 112. The second code CODE2 may correspond to any one of the codes CODE stored in the second memory 112. In an embodiment, the first processor 113 may select the second code CODE2 to be read by the second processor 114 among the codes CODE, stored in the second memory 112, and inform the second processor 114 regarding the second code CODE2 through the boost read signal BSTRD.

In an embodiment, the first processor 113 may control the second processor 114 to read the second code CODE2 from the second memory 112, while reading the first code CODE1 from the first memory 111.

In another embodiment, the first processor 113 may control the second processor 114 to read the second code CODE2 from the second memory 112, when not reading the first code CODE1 from the first memory 111.

In another embodiment, when the first processor 113 does not receive a command from the outside or is in an idle state, the first processor 113 may control the second processor 114 to read the second code CODE2 from the second memory 112.

The first processor 113 may transfer a boost run signal BSTRUN to the second processor 114, in order to control the second processor 114 to generate the second control signal CTL2 from the second code CODE2 and output the second control signal CTL2 to the execution unit 120. The first processor 113 may control the second processor 114 to output the second control signal CTL2 to the execution unit 120 at a point of time when an internal operation corresponding to the second control signal CTL2 is executed.

In an embodiment, the first processor 113 may select the second code CODE2 to be processed by the second processor 114 among one or more second codes CODE2 which are temporarily stored in a second storage unit 152, and inform the second processor 114 of the selected second code CODE2 through the boost run signal BSTRUN The second processor 114 may process the second code CODE2 based on the first clock signal CLK1 and the second clock signal CLK2. The second clock signal CLK2 may toggle at a faster cycle than the first clock signal CLK. For example, the cycle of the second clock signal CLK2 may be set to ½ of the cycle of the first clock signal CLK1.

Specifically, the second processor 114 may read the second code CODE2 from the second memory 112 based on the first clock signal CLK1, in response to the boost read signal BSTRD transferred from the first processor 113. The second processor 114 may temporarily store the second code CODE2 read from the second memory 112 in the second storage unit 152 therein. The second storage unit 152 may temporarily store one or more second codes CODE2 read from the second memory 112.

The second processor 114 may generate the second control signal CTL2 from the second code CODE2 and transfer the second control signal CTL2 to the execution unit 120 based on the second clock signal CLK2, in response to the boost run signal BSTRUN transferred from the first processor 113. The second processor 114 may include a boost processor.

The clock generator 115 may generate the initial first clock signal ICLK1, and provide the initial first clock signal ICLK1 to the first and second processors 113 and 114. The first and second processors 113 and 114 may generate and use the first clock signal CLK1 based on the initial first clock signal ICLK1. The clock generator 115 may generate the initial second clock signal ICLK2, and provide the initial second clock signal ICLK2 to the second processor 114. The initial second clock signal ICLK2 may toggle at a faster cycle than the initial first clock signal ICLK1. The second processor 114 may generate and use the second clock signal CLK2 based on the initial second clock signal ICLK2.

The execution unit 120 may execute an internal operation corresponding to the first control signal CTL1 transferred from the first processor 113 or the second control signal CTL2 transferred from the second processor 114 in response to the corresponding control signal. At this time, the execution unit 120 may execute the internal operation corresponding to the second control signal CTL2 faster, in response to the second control signal CTL2 transferred according to the faster second clock signal CLK2.

In accordance with the present embodiment, codes CODE which are required to be executed faster may be stored in the second memory 112 and read by the second processor 114. At this time, a read access of the second processor 114 to the second memory 112 may be based on the first clock signal CLK1, like a read access of the first processor 113 to the first memory 111. That is, the interface structures for the first and second memories 111 and 112 may follow a common structure based on the first clock signal CLK1, without any modification.

The second processor 114 may generate the second control signal CTL2 from the second code CODE2 read from the second memory 112 and transfer the second control signal CTL2 to the execution unit 120, based on the second clock signal CLK2, which is faster than the first clock signal CLK1. Therefore, the internal operation corresponding to the second control signal CTL2 may be rapidly executed. That is, the second code CODE2, which is required to be executed earlier, may be processed based on the fast second clock signal CLK2, even though the second code CODE2 is read from the second memory 112 based on the slow first clock signal CLK1. Furthermore, since the reading of the second code CODE2 is performed through a different interface independently of the first code CODE1, the reading of the second code CODE2 may be hidden as a background operation without disturbing the reading of the first code CODE1. As a result, the operation speed of the semiconductor device 100 can be improved.

Figure 2:
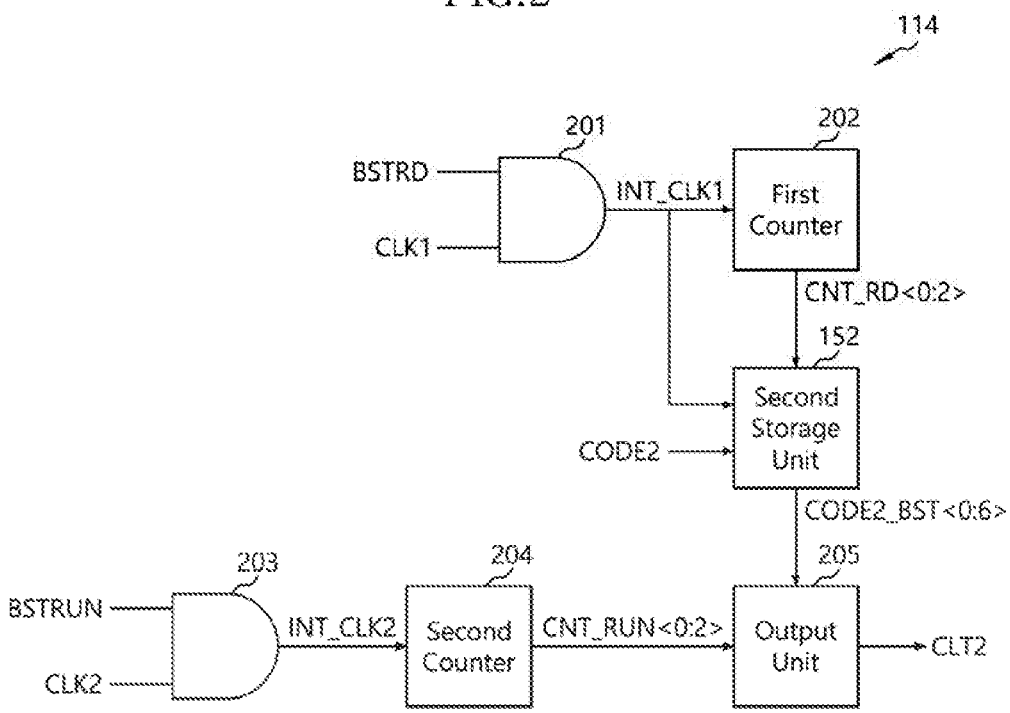
FIG. 2 is a block diagram illustrating a second processor of FIG. 1 in accordance with the embodiment.

FIG. 2 is a block diagram illustrating the second processor 114 of FIG. 1 in accordance with the present embodiment.

Referring to FIG. 2, the second processor 114 may be configured to perform AND operations. For example, the second processor 114 may include AND gates 201 and 203, a first counter 202, the second storage unit 152, a second counter 204 and an output unit 205.

The AND gate 201 may receive the boost read signal BSTRD and the first clock signal CLK1, perform an AND operation on the received signals, and output a first internal clock signal INT_CLK1. The AND gate 201 may output the first internal clock signal INT_CLK1 at a logic high level, when both of the boost read signal BSTRD and the first clock signal CLK1 are logic high. Meanwhile, the present embodiment is not limited thereto. In an embodiment, the AND gate 201 may be replaced by one or more operation logics which output the first internal clock signal INT_CLK1 at a logic high level, when both of the boost read signal BSTRD and the first clock signal CLK1 are logic high.

The first counter 202 may receive the first internal clock signal INT_CLK1 from the AND gate 201, increase its count whenever the first internal clock signal INT_CLK1 becomes logic high, and output a read count CNT_RD<0:2>. For example, the read count CNT_RD<0:2> may be configured as a 3-bit signal. For example, whenever the first internal clock signal INT_CLK1 becomes logic high, the read count CNT_RD<0:2> may be sequentially outputted as 001, 010, 011, 100, 101, 110 and 111. However, the present embodiment is not limited thereto.

The second storage unit 152 may receive the second code CODE2 in response to the first internal clock signal INT_CLK1 and the read count CNT_RD<0:2>, and store the received code as a boost code CODE2_BST<0:6>. The second storage unit 152 may output the boost code CODE2_BST<0:6> to the output unit 205. The configuration and operation of the second storage unit 152 will be described in detail with reference to FIG. 3.

The AND gate 203 may receive the boost run signal BSTRUN and the second clock signal CLK2, perform an AND operation on the received signals, and output a second internal clock signal INT_CLK2. The AND gate 203 may output the second internal clock signal INT_CLK2 at a logic high level, when both of the boost run signal BSTRUN and the second clock signal CLK2 are logic high. Meanwhile, the present embodiment is not limited thereto. In an embodiment, the AND gate 203 may be replaced by one or more operation logics which output the second internal clock signal INT_CLK2 at a logic high level, when both of the boost run signal BSTRUN and the second dock signal CLK2 are logic high.

The second counter 204 may receive the second internal clock signal INT_CLK2 from the AND gate 203, perform counting whenever the second internal clock signal INT_CLK2 becomes logic high, and output a run count CNT_RUN<0:2>. For example, the run count CNT_RUN<0:2> may be configured as a 3-bit signal. For example, whenever the second internal clock signal INT_CLK2 becomes logic high, the run count CNT_RUN<0:2> may be sequentially outputted as 001, 010, 011, 100, 101, 110 and 111. However, the present embodiment is not limited thereto.

The output unit 205 may output the boost code CODE2_BST<0:6> as the second control signal CTL2 in response to the run count CNT_RUN<0:2>. For example, the output unit 205 may include a multiplexer. The values of the run count CNT_RUN<0:2> may correspond to bits constituting the boost code CODE2_BST<0:6>, respectively. According to the value of the run count CNT_RUN<0:2>, the output unit 205 may output the corresponding bit of the boost code CODE2_BST<0:6> as the second control signal CTL2.

In an embodiment, each of the first and second counters 202 and 204 may further receive a corresponding reset signal (not illustrated). Each of the first and second counters 202 and 204 may be reset in response to the corresponding reset signal. For example, each of the first and second counters 202 and 204 may be reset to output 000.

Figure 3:
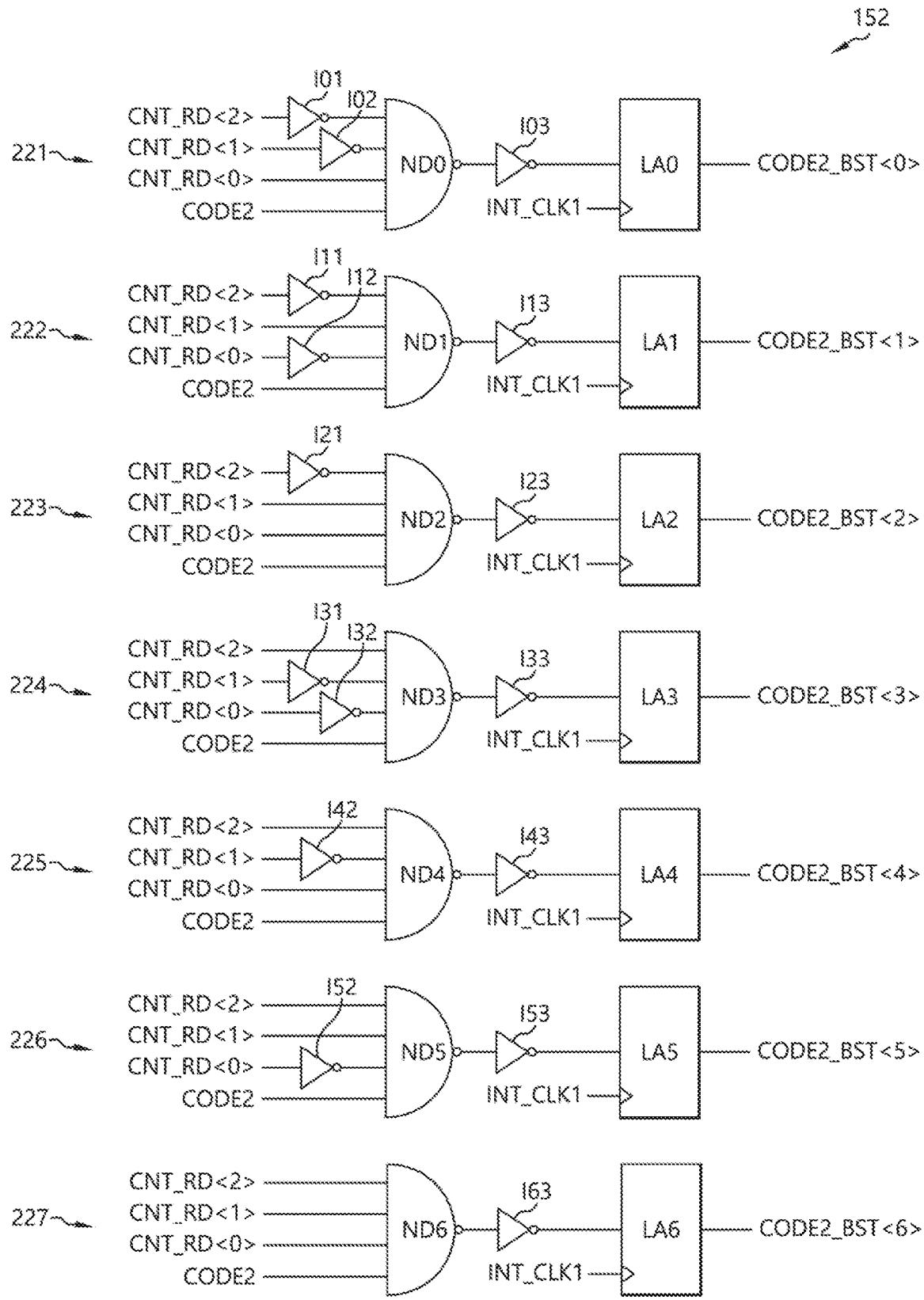
FIG. 3 is a block diagram illustrating a second storage unit of FIG. 2 in accordance with the embodiment.

FIG. 3 is a block diagram illustrating the second storage unit 152 of FIG. 2 in accordance with the present embodiment.

Referring to FIG. 3, the second storage unit 152 may include sub storage units 221 to 227. Each of the sub storage units 221 to 227 may receive the read count CNT_RD<0:2>, the second code CODE2 and the first internal clock signal INT_CLK1, and store and output the corresponding bit of the boost code CODE2_BST<0:6>. The sub storage units 221 to 227 may sequentially store the bits of the boost code CODE2_BST<0:6> from the first bit CODE2_BST<0> to the last bit CODE2_BST<6>.

Specifically, the sub storage unit 221 may be configured to perform inversion operations and NAND operations. For example, the sub storage unit 221 may include inverters I01 to I03, a NAND gate ND0 and a latch LA0. The high-order bit CNT_RD<2> of the read count CNT_RD<0:2> may be inputted to the inverter I01, and an output of the inverter I01 may be inputted to the NAND gate ND0. The middle-order bit CNT_RD<1> of the read count CNT_RD<0:2> may be inputted to the inverter I02, and an output of the inverter I02 may be inputted to the NAND gate ND0. The low-order bit CNT_RD<0> of the read count CNT_RD<0:2> may be inputted to the NAND gate ND0. The second code CODE2 may be inputted to the NAND gate ND0. The NAND gate ND0 may invert and output the second code CODE2 when the read count CNT_RD<0:2> is 001. The inverter I03 may invert and output the output of the NAND gate ND0. The latch LA0 may store the output of the inverter I03 as the first bit CODE2_BST<0> of the boost code CODE2_BST<0:6> in response to the first internal clock signal INT_CLK1.

Meanwhile, the present embodiment is not limited thereto. In an embodiment, each of the inverters I01 to I03 may be replaced by one or more operation logics which invert and output an input signal. In an embodiment, the NAND gate ND0 may be replaced by one or more operation logics which invert and output the second code CODE2 when the read count CNT_RD<0:2> is 001.

In short, the sub storage unit may store the first bit of the second code CODE2 as the first bit CODE2_BST<0> of the boost code CODE2_BST<0:6>, when the read count CNT_RD<0:2> is 001.

The other sub storage units 222 to 227 may sequentially operate to store the second code CODE2 as the bits of the boost code CODE2_BST<1:6>, when the read count CNT_RD<0:2> becomes 010, 011, 100, 101, 110 and 111. The other sub storage units 222 to 227 may be configured and operated in a similar manner to the sub storage unit 221. Therefore, the detailed descriptions thereof will be omitted herein.

In an embodiment, each of the latches LA0 to LA6 may further receive a corresponding reset signal (not illustrated). Each of the latches LA0 to LA6 may be reset in response to the corresponding reset signal. For example, each of the latches LA0 to LA6 may be reset to store 0.

In an embodiment, the latches LA0 to LA6 may be configured as various storage elements such as a register, flip-flop and fuse.

Figure 4:
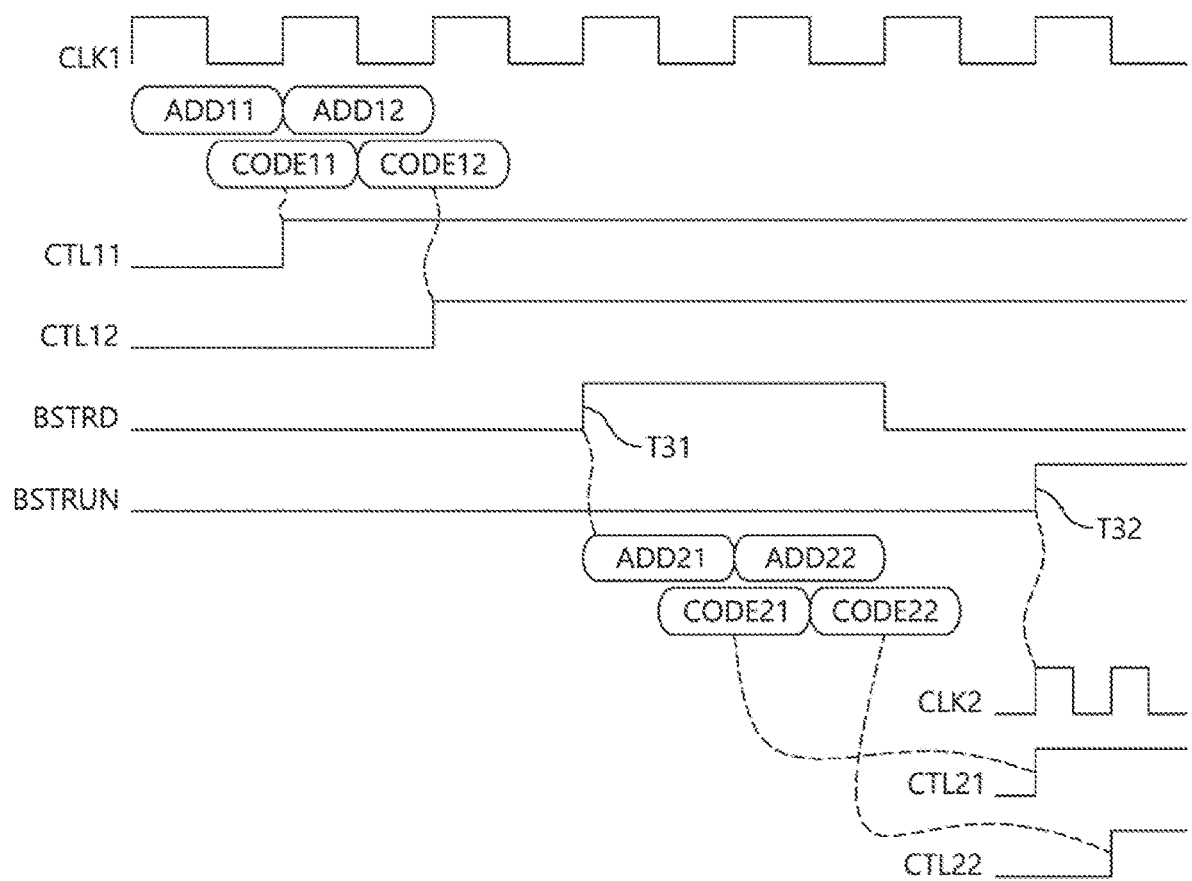
FIG. 4 is a waveform diagram for describing an operation of the semiconductor device of FIG. 1 in accordance with the embodiment.

FIG. 4 is a waveform diagram for describing an operation of the semiconductor device 100 of FIG. 1 in accordance with the embodiment.

Referring to FIG. 4, the first and second processors 113 and 114 may operate according to the first dock signal CLK1 having a predetermined cycle.

The first processor 113 may sequentially read codes CODE11 and CODE12 by transferring addresses ADD11 and ADD12 to the first memory 111 based on the first clock signal CLK1. The first memory 111 may read the codes CODE11 and CODE12 by accessing memory regions corresponding to the addresses ADD11 and ADD12 based on the first clock signal CLK1, and transfer the read codes CODE11 and CODE12 to the first processor 113. In FIG. 4, the number of the codes CODE11 and CODE12, read from the first memory 111, is merely an example.

The first processor 113 may generate first control signals CTL11 and CTL12 from the respective codes CODE11 and CODE12 based on the first clock signal CLK1, and sequentially transfer the first control signals CTL11 and CTL12 to the execution unit 120. FIG. 4 illustrates that the first control signals CTL11 and CTL12 are enabled at a high level. The first control signals CTL11 and CTL12 may be included in the first control signal CTL1 of FIG. 1.

The first processor 113 may transfer the boost read signal BSTRD to the second processor 114 at timing T31. At timing 31, the first processor 113 may enter an idle state, for example. At timing 31, the first processor 113 might not read or process a code from the first memory 111, for example.

The second processor 114 may sequentially read codes CODE21 and CODE22 by transferring addresses ADD21 and ADD22 to the second memory 112 based on the first clock signal CLK1, in response to the boost read signal BSTRD. The second memory 112 may read the codes CODE21 and CODE22 by accessing memory regions corresponding to the addresses ADD21 and ADD22 based on the first clock signal CLK1, and transfer the codes CODE21 and CODE22 to the second processor 114. In FIG. 4, the number of the codes CODE21 and CODE22, read from the second memory 112, is merely an example.

The codes CODE21 and CODE22 may be temporarily stored in the second storage unit 152 of the second processor 114.

The first processor 113 may transfer the boost run signal BSTRUN to the second processor 114 at timing T32. At timing T32, internal operations corresponding to the codes CODE21 and CODE22 may be performed.

The second processor 114 may operate according to the second clock signal CLK2. In FIG. 4, the cycle of the second clock signal CLK2 may be set to ½ of the cycle of the first clock signal CLK1, for example. In an embodiment, the first processor 113 may control the clock generator 115 to supply the initial second clock signal ICLK2 to the second processor 114, since the moment that the boost run signal BSTRUN was transferred to the second processor 114.

The second processor 114 may generate second control signals CTL21 and CTL22 from the respective codes CODE21 and CODE22 based on the second clock signal CLK2, and sequentially transfer the second control signals CTL21 and CTL22 to the execution unit 120, in response to the boost run signal BSTRUN. FIG. 4 illustrates that the second control signals CTL21 and CTL22 are enabled at a high level. The second control signals CTL21 and CTL22 may be included in the second control signal CTL2 of FIG. 1.

Therefore, the execution unit 120 may execute the internal operations corresponding to the second control signals CTL21 and CTL22 faster.

In FIG. 4, the first processor 113 may transfer the boost read signal BSTRD to the second processor 114 when in an idle state. This configuration might not impose a burden on the first processor 113, but maintain the power consumption of the semiconductor device 100 within a predetermined range, thereby contributing to a stable operation.

However, since the first and second processors 113 and 114 are exclusively coupled to the first and second memories 111 and 112 as described above, read operations may be performed on the first and second memories 111 and 112 in parallel to one another, as will be described below with reference to FIG. 5.

Figure 5:
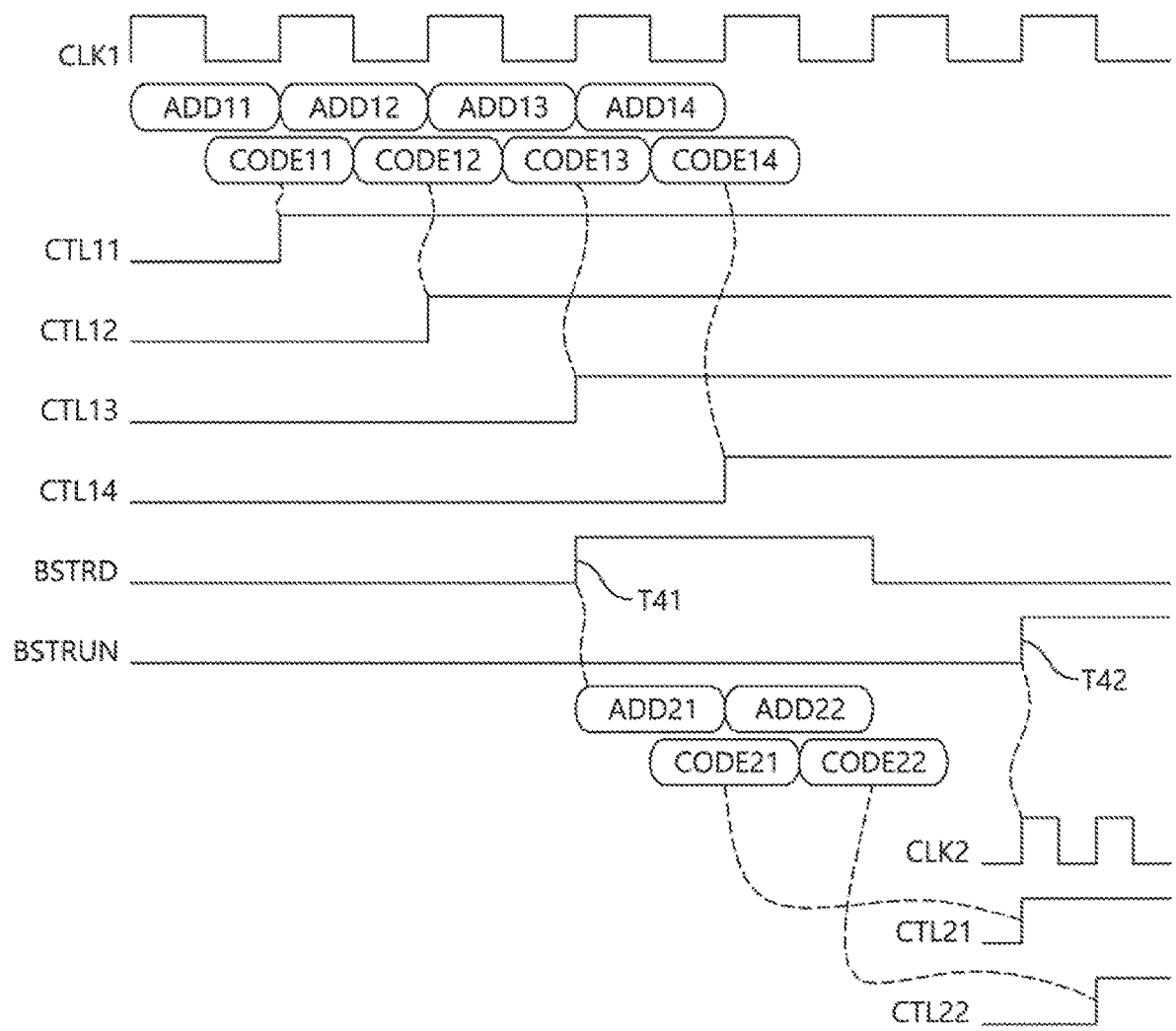
FIG. 5 is a waveform diagram for describing an operation of the semiconductor device of FIG. 1 in accordance with the embodiment.

FIG. 5 is a waveform diagram for describing an operation of the semiconductor device 100 of FIG. 1 in accordance with the embodiment.

Referring to FIG. 5, the first and second processors 113 and 114 may operate according to the first dock signal CLK1 having a predetermined cycle.

The first processor 113 may sequentially read codes CODE11 to CODE14 by transferring addresses ADD11 to ADD14 to the first memory 111 based on the first clock signal CLK1. The first memory 111 may read the codes CODE11 to CODE14 by accessing memory regions corresponding to the respective addresses ADD11 to ADD14 based on the first clock signal CLK1, and transfer the read codes CODE11 to CODE14 to the first processor 113. In FIG. 5, the number of the codes CODE11 to CODE14, read from the first memory 111, is merely an example.

The first processor 113 may generate first control signals CTL11 to CTL14 from the respective codes CODEl1 to CODE14 based on the first clock signal CLK1, and sequentially transfer the first control signals CTL11 to CTL14 to the execution unit 120. FIG. 5 illustrates that the first control signals CTL11 to CTL14 are enabled at a high level. The first control signals CTL11 to CTL14 may be included in the first control signal CTL1 of FIG. 1.

The first processor 113 may transfer the boost read signal BSTRD to the second processor 114 at timing T41. That is, the first processor 113 may control the second processor 114 to read codes CODE21 and CODE22 from the second memory 112 while reading and processing the codes CODE13 and CODE14 from the first memory 111.

The second processor 114 may sequentially read the codes CODE21 and CODE22 by transferring addresses ADD21 and ADD22 to the second memory 112 based on the first clock signal CLK1, in response to the boost read signal BSTRD. The second memory 112 may read the codes CODE21 and CODE22 by accessing memory regions corresponding to the addresses ADD21 and ADD22 based on the first clock signal CLK1, and transfer the read codes CODE21 and CODE22 to the second processor 114. In FIG. 5, the number of the codes CODE21 and CODE22 read from the second memory 112, is merely an example.

The codes CODE21 and CODE22 may be temporarily stored in the second storage unit 152 of the second processor 114.

The first processor 113 may transfer the boost run signal BSTRUN to the second processor 114 at timing T42. At timing T42, internal operations corresponding to the codes CODE21 and CODE22 may be performed.

The second processor 114 may operate according to the second clock signal CLK2. In FIG. 5, the cycle of the second clock signal CLK2 may be set to ½ of the cycle of the first clock signal CLK1, for example. In an embodiment, the first processor 113 may control the clock generator 115 to supply the initial second clock signal ICLK2 to the second processor 114 from the moment that the boost run signal BSTRUN is transferred to the second processor 114.

The second processor 114 may generate second control signals CTL21 and CTL22 from the respective codes CODE21 and CODE22 based on the second dock signal CLK2, and sequentially transfer the second control signals CTL21 and CTL22 to the execution unit 120, in response to the boost run signal BSTRUN. FIG. 4 illustrates that the second control signals CTL21 and CTL22 are enabled at a high level. The second control signals CTL21 and CTL22 may be included in the second control signal CTL2 of FIG. 1.

Therefore, the execution unit 120 may execute the internal operations corresponding to the second control signals CTL21 and CTL22 faster.

Figure 6:
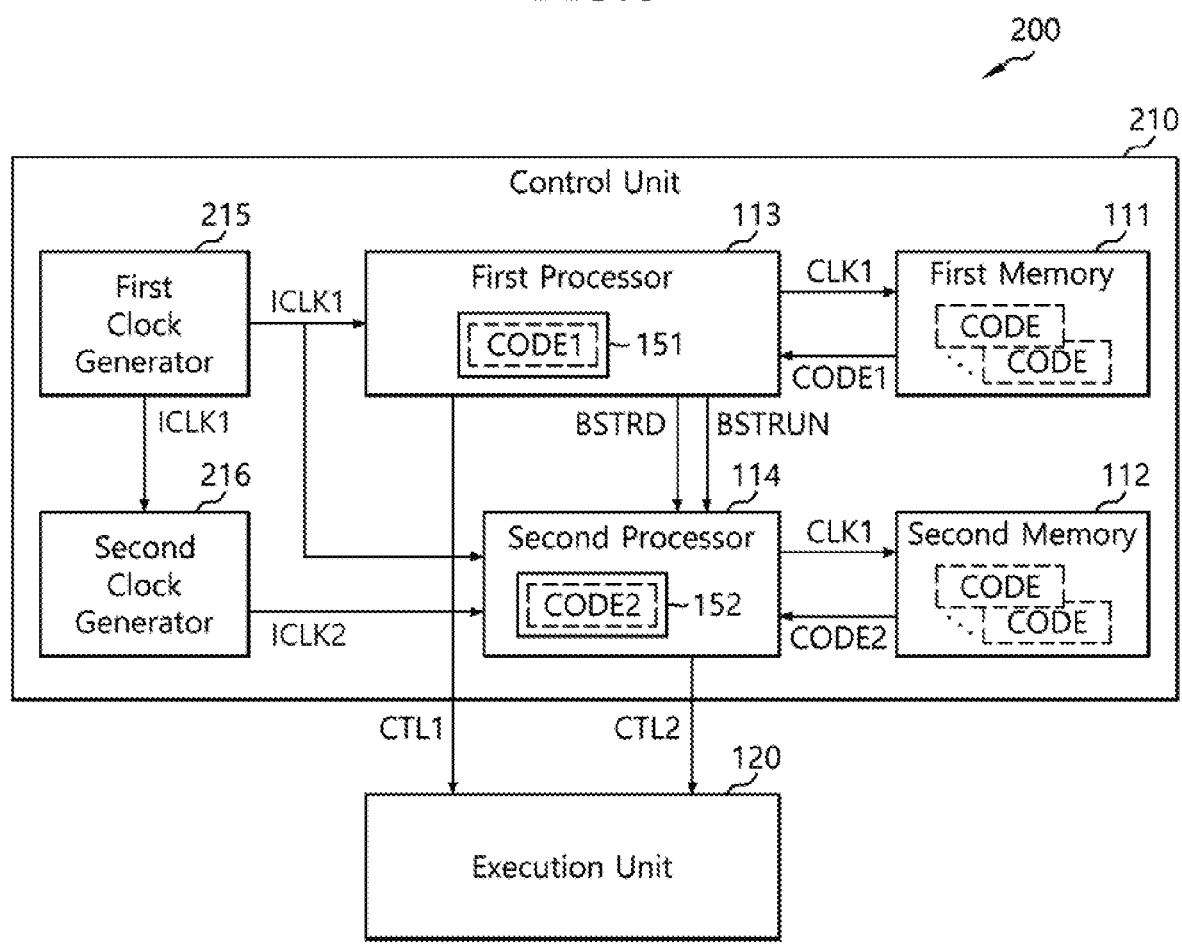
FIG. 6 is a block diagram illustrating a semiconductor device in accordance with an embodiment.

FIG. 6 is a block diagram illustrating a semiconductor device 200 in accordance with an embodiment.

Referring to FIG. 6, the semiconductor device 200 may be configured and operated in a substantially similar manner to the semiconductor device 100 of FIG. 1. Therefore, the following descriptions will be focused on differences of the semiconductor device 200 from the semiconductor device 100 of FIG. 1, and the detailed descriptions thereof will be omitted herein.

The semiconductor device 200 may include a first clock generator 215 and a second clock generator 216.

The first clock generator 115 may generate the initial first clock signal ICLK1, and provide the initial first clock signal ICLK1 to the first and second processors 113 and 114 and the second clock generator 216.

The second dock generator 216 may generate the initial second dock signal ICLK2 based on the initial first clock signal ICLK1, and provide the initial second clock signal ICLK2 to the second processor 114.

In an embodiment, the first clock generator 215 may be included in the first processor 113.

In an embodiment, the second clock generator 216 may be included in the second processor 114.

Figure 7:
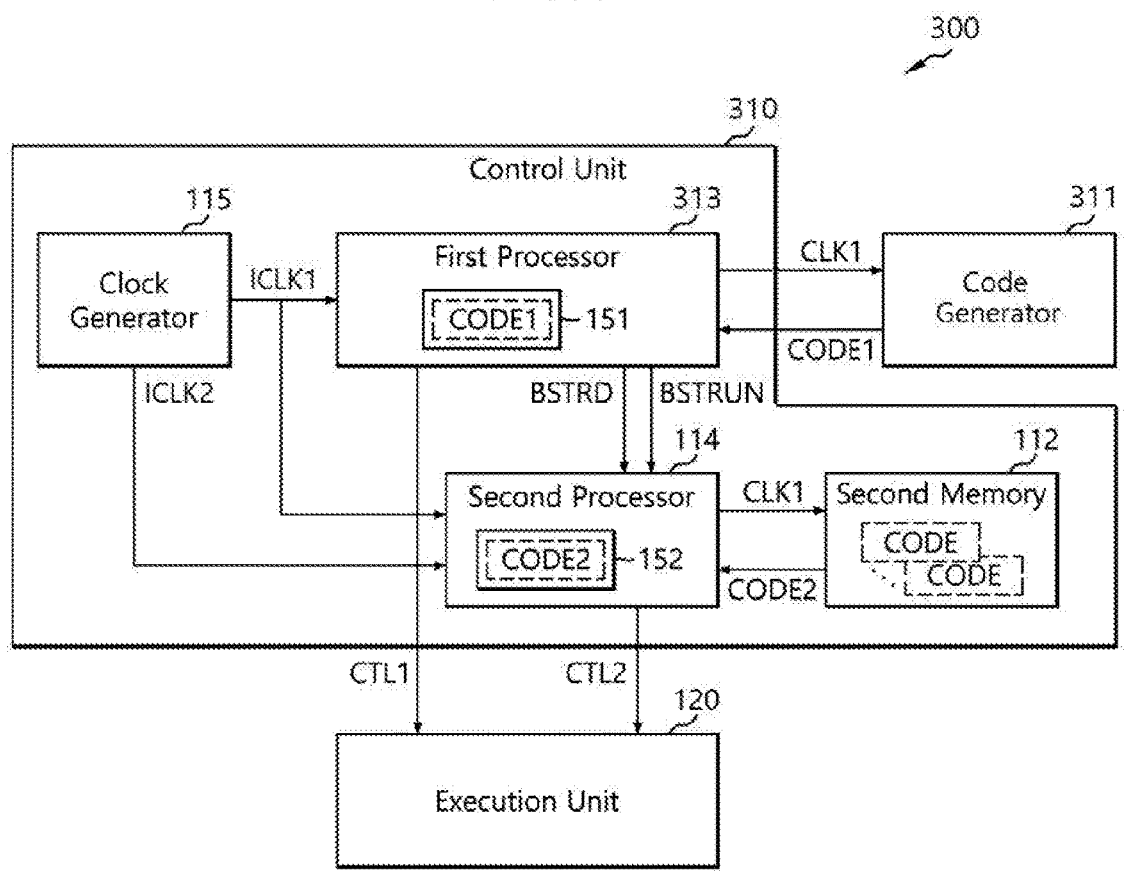
FIG. 7 is a block diagram illustrating a semiconductor memory device in accordance with an embodiment.

FIG. 7 is a block diagram illustrating a semiconductor device 300 in accordance with an embodiment.

Referring to FIG. 7, the semiconductor device 300 may be configured and operated in a substantially similar manner to the semiconductor device 100 of FIG. 1. Therefore, the following descriptions will be focused on differences of the semiconductor device 300 from the semiconductor device 100 of FIG. 1, and the detailed descriptions thereof will be omitted herein.

The semiconductor device 300 may include a code generator 311 and a control unit 310. The control unit 310 may include a first processor 313.

The code generator 311 may be electrically coupled to the first processor 313. The code generator 311 may operate based on a first clock signal CLK1 transferred from the first processor 313. The code generator 311 may transfer a first code CODE1 requested by the first processor 313 to the first processor 313, based on the first clock signal CLK1. In an embodiment, the code generator 311 may include the first memory 111 of FIG. 1. In an embodiment, the code generator 311 may generate and output the first code CODE1 according to a predetermined algorithm.

The first processor 313 may receive a first code CODE1 from the code generator 311 based on the first clock signal CLK1.

Figure 8:
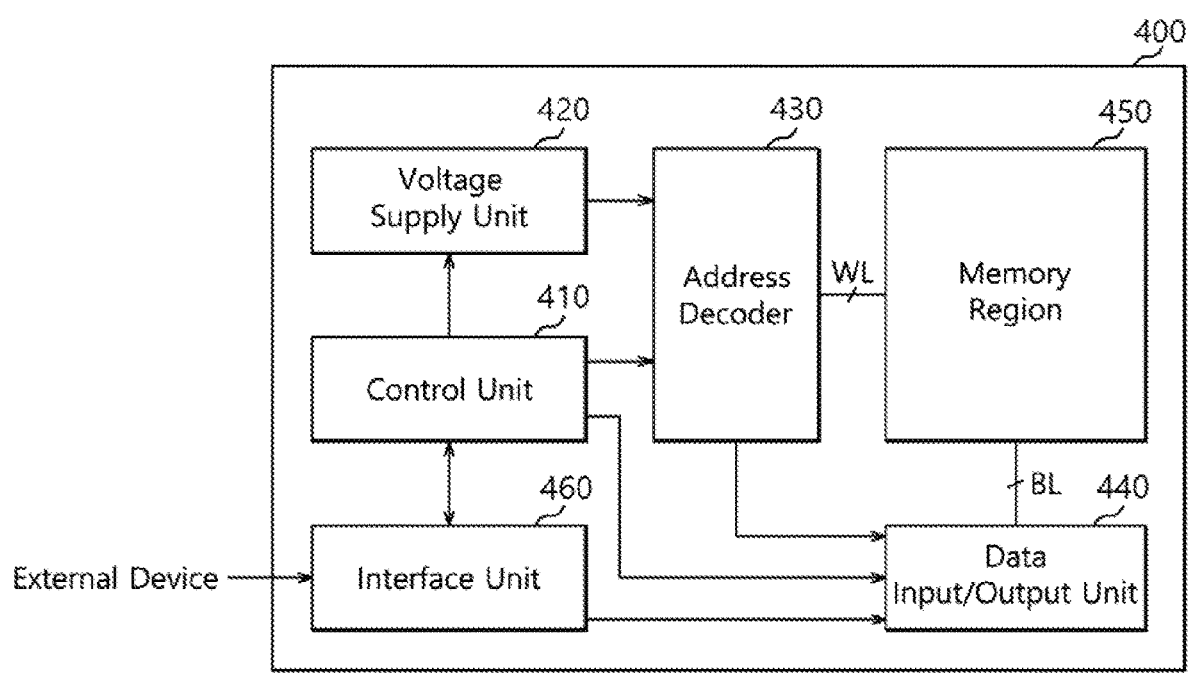
FIG. 8 is a block diagram illustrating a semiconductor memory device in accordance with an embodiment.

FIG. 8 is a block diagram illustrating a semiconductor memory device 300 in accordance with an embodiment.

Referring to FIG. 8, the semiconductor memory device 400 may include a control unit 410, a voltage supply unit 420, an address decoder 430, a data input/output unit 440, a memory region 450 and an interface unit 460.

The control unit 410 may control overall operations of the semiconductor memory device 400 according to control of an external device. The control unit 410 may receive a command transferred from the external device through the interface unit 460, and transfer control signals to the internal units of the semiconductor memory device 400 in response to the command. The control unit 410 may operate in a similar manner to the control unit 110 of FIG. 1 or the control unit 210 of FIG. 4.

The voltage supply unit 420 may generate various operation voltages required for the overall operations of the semiconductor memory device 400 according to control of the control unit 410. The voltage supply unit 420 may supply an erase voltage required for an erase operation to a memory block selected from the memory region 450, for example. The voltage supply unit 420 may supply the address decoder 430 with various voltages to be used during write or read operation, for example.

The address decoder 430 may decode an address to select a portion to be accessed in the memory region 450. The address decoder 430 may control the data input/output unit 440 to selectively drive word lines WL and selectively drive bit lines BL according to the decoding result.

The data input/output unit 440 may transfer data received from the interface unit 460 to the memory region 450 through the bit lines BL. The data input/output unit 440 may transfer data to the interface unit 460, the data being read from the memory region 450 through the bit lines BL. The data input/output unit 440 may sense a current which is formed as a memory cell included in the memory region 450 is turned on/off in response to a read voltage, and acquire data read from the memory cell according to the sensing result.

The memory region 450 may be coupled to the address decoder 430 through the word lines WL, and coupled to the data input/output unit 440 through the bit lines BL. The memory region 450 may include a plurality of memory cells (not illustrated) arranged at the respective intersections between the word lines WL and the bit lines BL, and configured to store data. The memory region 450 may include a memory cell array (not illustrated) with a 2D or 3D structure.

The voltage supply unit 420, the address decoder 430, the data input/output unit 440 and the memory region 450 may operate in a similar manner to the execution unit 120 of FIG. 1 or 4.

The interface unit 460 may exchange various control signals and data with the external device, the various control signals including commands and addresses. The interface unit 460 may transfer the input various control signals and data to the internal units of the semiconductor memory device 400.

While various embodiments have been described above, it will be understood to those skilled in the art that the embodiments described are examples only. Accordingly, the operating method of a data storage device described herein should not be limited based on the described embodiments.

What is claimed is:

1. A semiconductor device comprising:
   a first memory configured to store a first code;
   a second memory configured to store a second code;
   a first processor electrically coupled to the first memory and configured to process the first code based on a first clock signal; and
   a second processor, controlled by the first processor, electrically coupled to the second memory, and configured to process the second code based on the first clock signal and a second clock signal,
   wherein the second clock signal has a faster cycle than the first clock signal.

2. The semiconductor device of claim 1, further comprising:
   an execution unit,
   wherein the first processor, based on the first clock signal, reads the first code from the first memory, generates a first control signal from the first code, and outputs the first control signal to the execution unit, and
   the execution unit executes a first internal operation in response to the first control signal.

3. The semiconductor device of claim 2, wherein the second processor reads the second code from the second memory based on the first clock signal, generates a second control signal from the second code and outputs the second control signal to the execution unit based on the second clock signal, and
   the execution unit executes a second internal operation in response to the second control signal.

4. The semiconductor device of claim 3, wherein the second processor comprises a register, and the second processor, controlled by the first processor, temporarily stores the second code in the register before generating the second control signal.

5. The semiconductor device of claim 1, wherein the first processor controls the second processor to read the second code from the second memory, while in an idle state.

6. The semiconductor device of claim 1, wherein the first processor controls the second processor to read the second code from the second memory, while reading the first code from the first memory.

7. The semiconductor device of claim 1, wherein the first and second processors are exclusively coupled to the first and second memories, respectively.

8. A semiconductor device comprising:
   a first processor configured to generate a first control signal from a first code and output the first control signal, based on a first clock signal;
   a second processor, controlled by the first processor, configured to generate a second control signal from a second code and output the second control signal, based on a second clock signal; and
   an execution unit configured to execute an internal operation corresponding to the first or second control signal, in response to the corresponding control signal.

9. The semiconductor device of claim 8, further comprising a first memory exclusive coupled to the first processor and configured to store the first code,
   wherein the first processor reads the first code from the first memory based on the first clock signal.

10. The semiconductor device of claim 8, further comprising a second memory exclusively coupled to the second processor and configured to store the second code,
    wherein the second processor reads the second code from the second memory based on the first clock signal, according to control of the first processor.

11. The semiconductor device of claim 10, wherein the second processor comprises a register, and the second processor, controlled by the first processor, temporarily stores the second code in the register before generating the second control signal.

12. The semiconductor device of claim 10, wherein the first processor controls the second processor to read the second code from the second memory, while in an idle state.

13. The semiconductor device of claim 8, wherein the second clock signal has a faster cycle than the first clock signal.

14. A semiconductor device comprising:
    a boost memory configured to store a boost code;
    a first processor configured to operate based on a first clock signal;

a second processor, controlled by the first processor, electrically coupled to the boost memory, and configured to read the boost code from the boost memory based on the first clock signal, generate a boost control signal from the boost code and output the boost control signal, based on a second clock signal having a faster cycle than the first clock signal; and an execution unit configured to execute an internal operation in response to the boost control signal.

15. The semiconductor device of claim 14, wherein the first processor transfers a boost read signal and a boost run signal to the second processor, and the second processor reads the boost code from the boost memory in response to the boost read signal, and generates and outputs the boost control signal in response to the boost run signal.

16. The semiconductor device of claim 14, further comprising a main memory electrically coupled to the first processor and configured to store a main code, wherein the first processor reads the main code from the main memory based on the first clock signal, generates a main control signal from the main code and outputs the main control signal to the execution unit, based on the first clock signal.

17. The semiconductor device of claim 16, wherein the first and second processors are exclusively coupled to the main memory and the boost memory, respectively.

18. The semiconductor device of claim 16, wherein the first processor controls the second processor to read the boost code from the boost memory, while in an idle state.

19. The semiconductor device of claim 18, wherein the first processor controls the second processor to read the boost code from the boost memory, while reading the main code from the main memory.

20. The semiconductor device of claim 14, wherein the second processor comprises a register, and the second processor, controlled by the first processor, temporarily stores the boost code in the register before generating the boost control signal.

* * * * *